(12) United States Patent
Lee et al.

(10) Patent No.: US 9,946,120 B2
(45) Date of Patent: Apr. 17, 2018

(54) DISPLAY DEVICE

(71) Applicant: Samsung Display Co., Ltd., Yongin-si, Gyeonggi-do (KR)

(72) Inventors: Sang-Myoung Lee, Seoul (KR); Woong Kwon Kim, Cheonan-si (KR); Bum Ki Baek, Suwon-si (KR); Seung Ki Song, Suwon-si (KR); Kang-Young Lee, Seongnam-si (KR); Seong Jun Hwang, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/190,067

(22) Filed: Jun. 22, 2016

(65) Prior Publication Data

US 2017/0123281 A1 May 4, 2017

(30) Foreign Application Priority Data

Oct. 30, 2015 (KR) .......................... 10-2015-0152382

(51) Int. Cl.
| | |
|---|---|
| G02F 1/1343 | (2006.01) |
| H01L 41/107 | (2006.01) |
| H01L 27/20 | (2006.01) |
| G02F 1/1368 | (2006.01) |
| G02F 1/1333 | (2006.01) |

(52) U.S. Cl.
CPC ...... *G02F 1/134309* (2013.01); *G02F 1/1368* (2013.01); *G02F 1/133305* (2013.01); *H01L 27/20* (2013.01); *H01L 41/107* (2013.01); *G02F 2001/133394* (2013.01); *G02F 2201/123* (2013.01)

(58) Field of Classification Search
CPC ................................................ G02F 1/134309
See application file for complete search history.

(56) References Cited

U.S. PATENT DOCUMENTS

| | | | | |
|---|---|---|---|---|
| 2014/0118910 A1* | 5/2014 | Sung | ....................... | G09F 9/301 361/679.01 |
| 2015/0192481 A1* | 7/2015 | Nguyen | .................... | G01L 1/22 345/206 |

FOREIGN PATENT DOCUMENTS

| | | |
|---|---|---|
| JP | 2004-349305 A | 12/2004 |
| KR | 10-2013-0117110 A | 10/2013 |
| KR | 10-2014-0025923 A | 3/2014 |
| KR | 10-2014-0112871 A | 9/2014 |

* cited by examiner

*Primary Examiner* — Edmond Lau
(74) *Attorney, Agent, or Firm* — Lewis Roca Rothgerber Christie LLP

(57) ABSTRACT

A display device according to an exemplary embodiment of the present invention includes a flexible first substrate including a display area, and a non-display area around the display area, a first piezoelectric material layer—at one side of the first substrate, an intermediate electrode layer contacting the first piezoelectric material layer, a piezoelectric material layer driver coupled to the intermediate electrode layer, and configured to apply a driving voltage to the intermediate electrode layer to form an electric field at the first piezoelectric material layer, a thin film transistor at one side of the first substrate, and a pixel electrode connected to the thin film transistor.

19 Claims, 10 Drawing Sheets

| Inch | L (mm) | W (mm) | ΔX rate (same T,Vp) |
|---|---|---|---|
| 40 | 895 | 509 | 1 |
| 48 | 1064 | 604 | 1.191 |
| 55 | 1224 | 697 | 1.365 |
| 65 | 1458 | 815 | 1.614 |
| 75 | 1652 | 944 | 1.860 |

DISPLAY DEVICE

CROSS-REFERENCE TO RELATED APPLICATION

This application claims priority to, and the benefit of, Korean Patent Application No. 10-2015-0152382 filed in the Korean Intellectual Property Office on Oct. 30, 2015, the entire contents of which are incorporated herein by reference.

BACKGROUND

1. Field

Embodiments of the present invention relate to a display device.

2. Description of the Related Art

Modern display devices currently-include a liquid crystal display (LCD), a plasma display panel (PDP), an organic light emitting diode (OLED) display, and the like. Techniques for reducing weight and thickness of these display devices, and techniques for varying flat shapes thereof, have been developed.

Among the display devices, the liquid crystal display is currently widely used, and includes two display units on which a respective electric field generating electrode, such as a pixel electrode and a common electrode, is formed, and a liquid crystal layer between the display units. The liquid crystal display generates an electric field for manipulating the liquid crystal layer by applying voltage across the electric field—generating electrodes. Accordingly, the liquid crystal display determines a direction of liquid crystal molecules of the liquid crystal layer through the generated electric field, and displays an image by controlling polarization of incident light through the liquid crystal layer.

The organic light emitting diode display has a self-luminance characteristic, and includes two electrodes facing each other with an organic layer—between the two electrodes. In the organic light emitting diode display, when holes injected from an anode, and electrons injected from a cathode, meet each other at a light emitting layer to generate an exciton, and when the exciton is subjected to photoluminescence quenching, light is generated.

In such a display device, a bendable (curved) display device can be configured by using a flexible substrate. In this case, if a curvature of the display device is fixed, an immersion sense may be decreased depending on a viewing distance of a user.

The above information disclosed in this Background section is only for enhancement of understanding, and therefore may contain information that does not form the prior art.

SUMMARY

Embodiments of the present invention provide a display device with a varying curvature that depends on conditions of viewers.

A display device according to an exemplary embodiment of the present invention includes a flexible first substrate including a display area, and a non-display area around the display area, a first piezoelectric material layer at one side of the first substrate, an intermediate electrode layer contacting the first piezoelectric material layer, a piezoelectric material layer driver coupled to the intermediate electrode layer, and configured to apply a driving voltage to the intermediate electrode layer to form an electric field at the first piezoelectric material layer, a thin film transistor at one side of the first substrate, and a pixel electrode connected to the thin film transistor.

The piezoelectric material layer may be configured to be transformed according to the driving voltage, and the display panel may be configured to have a radius of curvature that corresponds to a distance of a user from the display area depending on transformation of the piezoelectric material layer.

The piezoelectric material layer driver may be configured to apply the driving voltage of more than about 10 V to less than about 200 V, and the display device may be configured to have a radius of curvature of more than about 1000R to less than about 8000R.

A thickness of the first piezoelectric material layer may be less than about 4000 Å.

The display device may further include a second piezoelectric material layer overlapping the first piezoelectric material layer.

The first piezoelectric material layer and the second piezoelectric material layer may be formed with an electric field of the same direction.

The intermediate electrode layer may cover a side surface of the first piezoelectric material layer and the second piezoelectric material layer.

The first piezoelectric material layer and the second piezoelectric material layer may cover an entirety of the display area and part of the non-display area.

The piezoelectric material layer may be configured to apply the driving voltage to form the electric field of a same direction at the first piezoelectric material layer and the second piezoelectric material layer.

The first piezoelectric material layer and the second piezoelectric material layer may overlap the non-display area to encircle the display area.

The display device may further include a flexible second substrate facing the first substrate, and a liquid crystal layer or an organic emission layer between the first substrate and the second substrate.

The intermediate electrode may cover an entirety of the display area and a part of the non-display area.

The first piezoelectric material layer may cover an entirety of the display area and a part of the non-display area.

The first piezoelectric material layer may overlap part of the non-display area to encircle the display area.

The display device may further include a flexible second substrate facing the first substrate, and a liquid crystal layer or an organic emission layer between the first substrate and the second substrate.

The intermediate electrode may be positioned at the entire display area and the part of the non-display area.

The first piezoelectric material layer may cover an entirety of the display area and a part of the non-display area.

The first piezoelectric material layer may overlap a part of the non-display area to encircle the display area.

The display device may further include a flexible second substrate facing the first substrate, and a liquid crystal layer or an organic emission layer between the first substrate and the second substrate.

DETAILED DESCRIPTION

Figure 1:
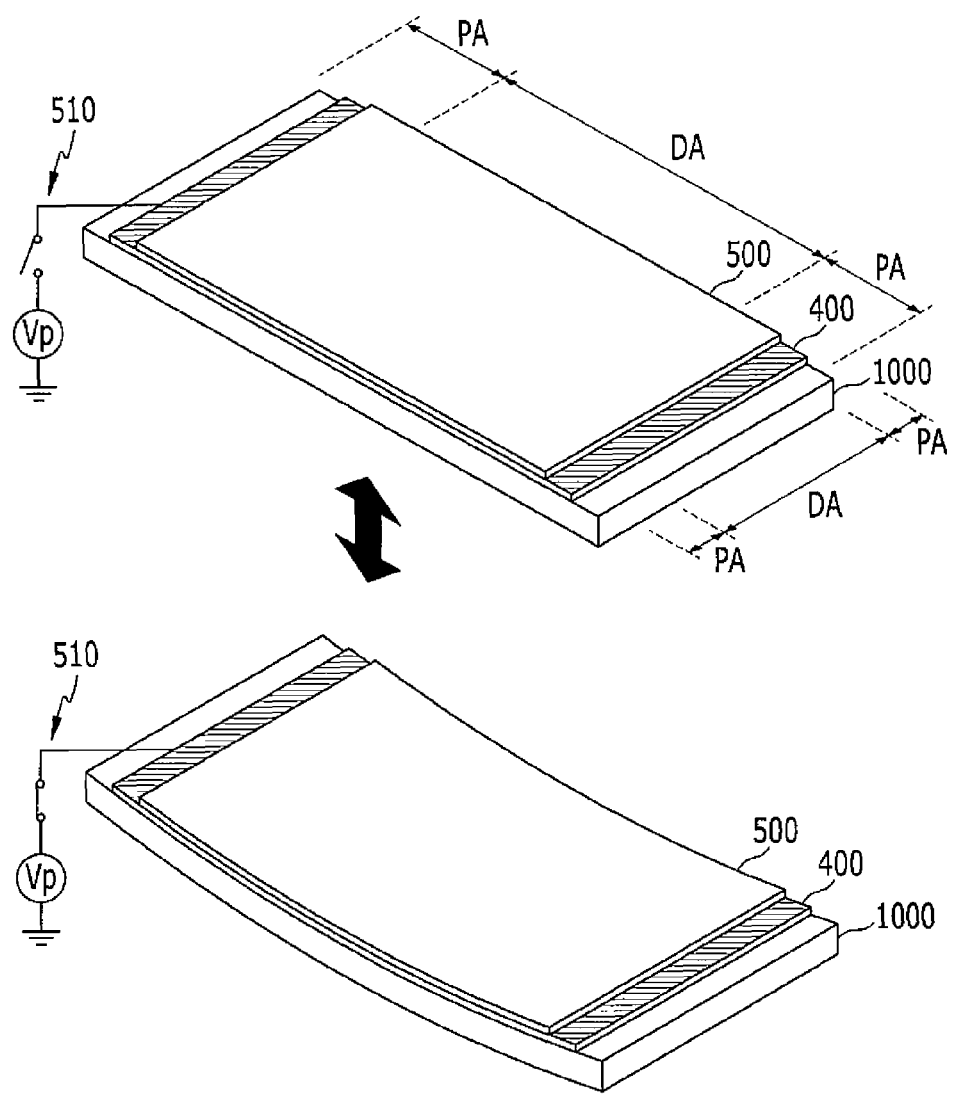
FIG. 1 is a schematic view showing a display device according to an exemplary embodiment of the present invention.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Display device according to exemplary embodiments of the present invention will be described with reference to FIGS. 1 to 8.

FIG. 1 is a schematic view showing a display device according to an exemplary embodiment of the present invention. FIGS. 2 to 8 are schematic cross-sectional views showing display device according to exemplary embodiments of the present invention.

As shown in FIG. 1, the display device according to an exemplary embodiment of the present invention includes a display panel 1000, an intermediate electrode layer 400, a piezoelectric material layer 500, and a piezoelectric material layer driver 510.

The display panel 1000 may be a liquid crystal display (LCD), in which a voltage is applied to field-generating electrodes, such as a pixel electrode and a common electrode, to generate an electric field to a liquid crystal layer between the field-generating electrodes, such that a direction of the liquid crystal molecules of the liquid crystal layer is determined, thereby displaying images by controlling polarization of incident light.

One example of the display panel 1000 will be described with reference to FIG. 2.

Figure 2:
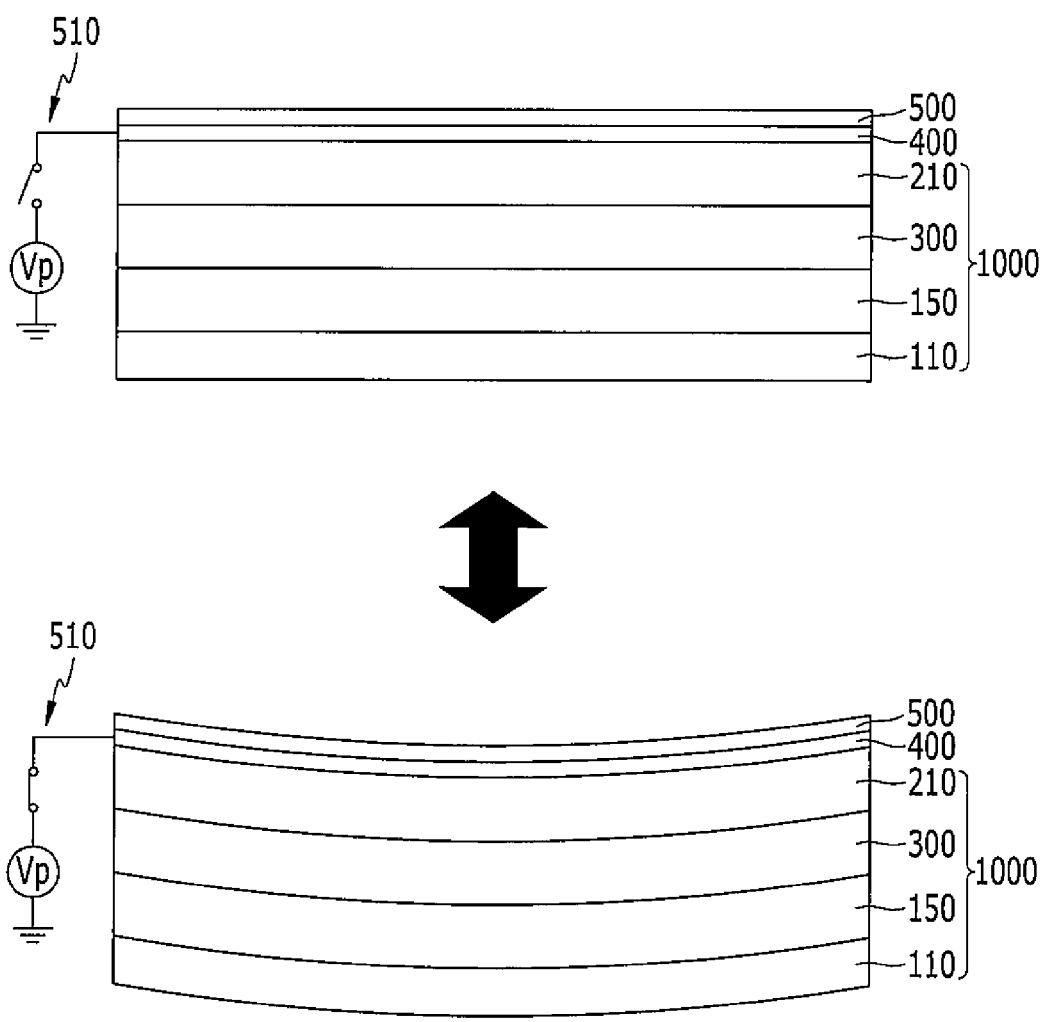
FIGS. 2 to 8 are schematic cross-sectional views showing a display device according to embodiments of the present invention.

Referring to FIG. 2, the display panel 1000 includes a flexible first substrate 110 and a flexible second substrate 210, and a thin film layer 150 and a liquid crystal layer 300 positioned between the first substrate 110 and the second substrate 210.

The material forming the first substrate 110 and the second substrate 210 may be thin glass, plastic, and the like, although various materials having flexibility may be used. The first substrate 110 and the second substrate 210 include a display area DA as a region for displaying an image, and include a non-display area PA as a peripheral area enclosing the display area DA (see FIG. 1).

The thin film layer 150 is on the first substrate 110. The thin film layer 150 is shown as a single layer in FIG. 2, although a plurality of layers may be included (e.g., a semiconductor layer, a gate layer, a source and drain layer, and other insulating layers, such as a gate insulating layer and an interlayer insulating layer, may be included). That is, according to an exemplary embodiment, the thin film layer 150 includes a barrier layer on the first substrate 110, a semiconductor layer on the barrier layer, a gate insulating layer on the semiconductor layer, a gate electrode on the gate insulating layer, an interlayer insulating layer on the gate insulating layer, and a source electrode and a drain electrode respectively connected to a source region and a drain region of the semiconductor layer through respective contact holes in the interlayer insulating layer and the gate insulating layer. Here, the gate insulating layer and the interlayer insulating layer may be made of an inorganic insulating material.

Accordingly, the thin film layer 150 may have various structures, and may include a plurality of thin film transistors corresponding to every pixel.

The liquid crystal layer 300 includes the liquid crystal molecules, and if the voltage is applied to the pixel electrode and the common electrode, the electric field is generated across the liquid crystal layer 300 between the pixel electrode and the common electrode to determine the direction of liquid crystal molecules by the electric field, thereby displaying an image.

Referring to FIG. 2, the structure of the display panel 1000 was schematically described, although the display panel 1000 shown in FIG. 2 is a schematic view, and the structure of the display panel 1000 is not limited thereto, and different types of display panels for displaying an image may be applied. For example, the display panel 1000 may be an organic light emitting panel or a plasma display panel.

The intermediate electrode layer 400 is positioned on the display panel 1000, and the piezoelectric material layer 500 is positioned on the intermediate electrode layer 400. The piezoelectric material layer driver 510 is connected to the intermediate electrode layer 400.

Referring to FIG. 1, in a plan view, the intermediate electrode layer 400 and the piezoelectric material layer 500 may have a quadrangle shape, and may be positioned to be at an entirety of the display area DA, and to also be at part of the non-display area PA adjacent the display area DA. However, the shape of the intermediate electrode layer 400 and the piezoelectric material layer 500 is not limited thereto. As shown in FIG. 1, the intermediate electrode layer 400 is not larger than, or may be smaller than, the piezoelectric material layer 500. Also, the shapes of the intermediate electrode layer 400 and the piezoelectric material layer 500 may be different. The shape of, or the deposition structure of, the intermediate electrode layer 400 may be varied such that the electric field, which causes the piezoelectric material layer 500 to have the curvature, is generated to the piezoelectric material layer 500.

The piezoelectric material layer 500 may include a piezoelectric ceramic or a piezoelectric polymer. The piezoelectric ceramic may include at least one among PLZT, PZT, $PbTiO_3$, $BaTiO_3$, and the like.

The piezoelectric material layer 500 may be deposited by a chemical vapor deposition (CVD) or a sputtering method, and a thickness of piezoelectric material layer 500 may be less than about 4000 Å. When the piezoelectric material layer 500 is not adhered as a film type, but is directly deposited on the intermediate electrode layer 400, the relatively thin thickness may be realized, such that the transmittance of the display device may be improved.

If a driving voltage Vp of a first polarity is applied to the intermediate electrode layer 400 by the piezoelectric material layer driver 510, the electric field is generated to the piezoelectric material layer 500 such that the piezoelectric material layer 500 is deformed (e.g., curved, or bent). Depending on the polarity of the driving voltage Vp applied to the piezoelectric material layer 500, and depending on a part where the driving voltage is applied, a tension and a contraction of the piezoelectric material layer 500 may be generated, and the tension and the contraction may be simultaneously generated at various parts of the piezoelectric material layer 500, and the form of the piezoelectric material layer 500 is changed by this principle.

In the present exemplary embodiment, as shown in a lower portion of FIG. 1, edge regions are raised upward, and the center region is deformed downward, thereby generating the transformation. If a driving signal/driving voltage of a second polarity that is opposite to the first polarity is applied, the transformation is generated in the opposite direction. As the form of the piezoelectric material layer 500 is transformed, the shape of the display panel 1000 adhered with the piezoelectric material layer 500 is correspondingly transformed to have the curvature. The curvature of the display panel 1000 is varied depending on the magnitude of the driving voltage Vp applied to the intermediate electrode layer 400 by the piezoelectric material layer driver 510. Accordingly, by controlling the magnitude and polarity of the driving voltage Vp, the display panel 1000 may be controlled to have the various curvatures. The magnitude and polarity of the driving voltage Vp may be controlled based on the distance of the user from the display area DA. The piezoelectric material layer driver 510 may apply a voltage of more than about 10 V to less than about 200 V to the intermediate electrode layer 400, thereby, the piezoelectric material layer 500 and the display panel 1000 are varied to have a radius of curvature (e.g., a curvature radius) of more than about 1000R to less than about 8000R.

The intermediate electrode layer 400 may be a transparent conductive metal. The intermediate electrode layer 400 may be a thin carbon electrode or a conductive metal oxide. The conductive metal oxide may be, for example, a transparent metal oxide, such as indium-tin-oxide (ITO), fluorinated tin oxide (FTO), indium oxide (IO), and tin oxide (SnO2).

Figure 3:
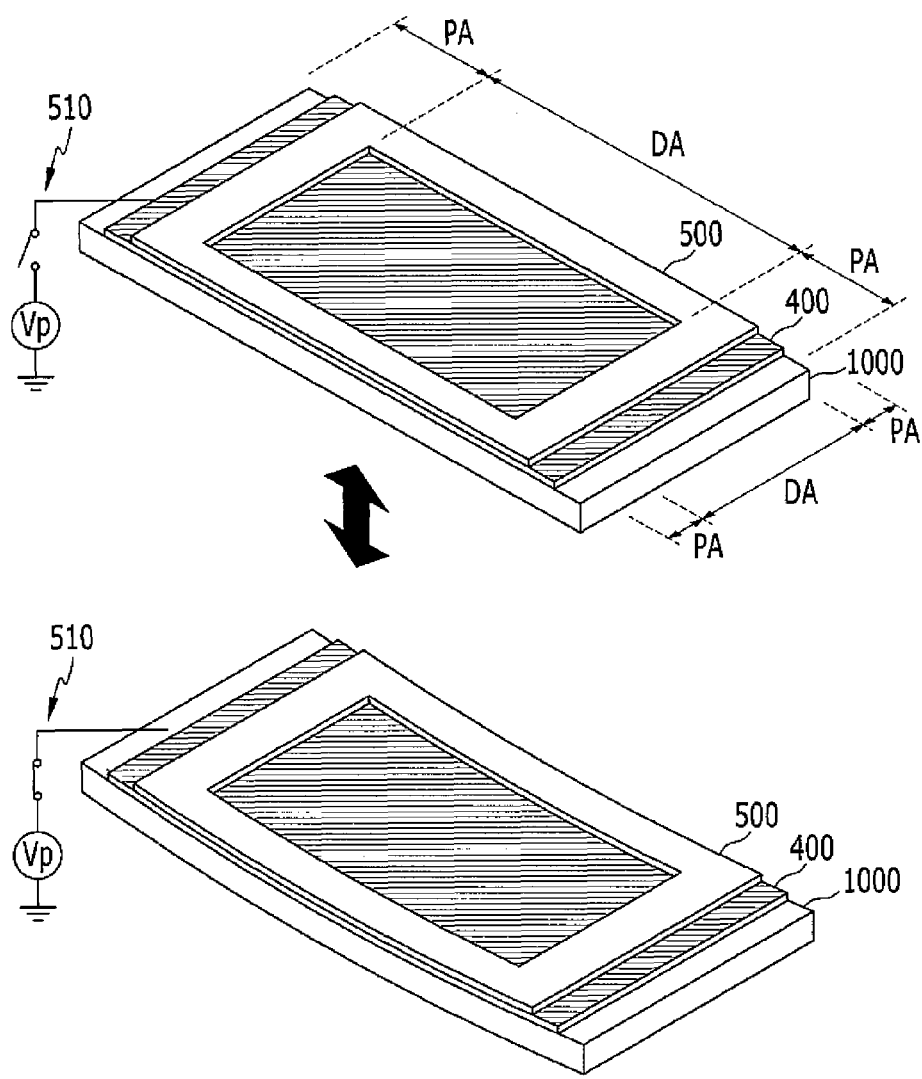

Next, the display device according to another exemplary embodiment of the present invention will be described in detail with reference to FIG. 3. The display device according to the exemplary embodiment shown in FIG. 3 is similar to the display device according to the exemplary embodiment described with reference to FIGS. 1 and 2. The same reference numerals indicate similar constituent elements, and the detailed description of the same constituent elements is omitted. Different configurations from the above-described exemplary embodiment will be focused on.

FIG. 3 is a schematic view of a display device according to an exemplary embodiment of the present invention.

The intermediate electrode layer 400 is positioned on the display panel 1000, and the piezoelectric material layer 500a is positioned thereon. The piezoelectric material layer driver 510 is connected to the intermediate electrode layer 400.

In the present exemplary embodiment, in the plan view, the intermediate electrode layer 400 has the quadrangle shape, and may be positioned at an entirety of the display area DA, and at the part of the non-display area PA near the display area DA. The piezoelectric material layer 500 with a form enclosing, or corresponding to an edge of, the display area DA has a rectangular strip form enclosing the edge of the display area DA, and also overlaps part of the non-display area PA that is adjacent the display area DA. However, the forms of the intermediate electrode layer 400 and the piezoelectric material layer 500 are not limited thereto. Like the display device according to the present exemplary embodiment, if the piezoelectric material layer 500 is formed to enclose, or encircle, the display area DA, yet does not overlap the display area DA, transmittance reduction of the display device otherwise caused by the piezoelectric material layer 500 may be prevented.

If the driving voltage Vp of the first polarity is applied to the intermediate electrode layer 400 by the piezoelectric material layer driver 510, the electric field is generated to the piezoelectric material layer 500, such that the curvature of the display panel 1000 is transformed or changed as the shape of the piezoelectric material layer 500 is transformed. The curvature of the display panel 1000 may be variably formed depending on the magnitude and polarity of the driving voltage Vp.

The display panel 1000 may be applied to all display panels displaying an image. For example, the display panel 1000 may be the liquid crystal panel, the organic light emitting panel, or the plasma display panel.

Figure 4:
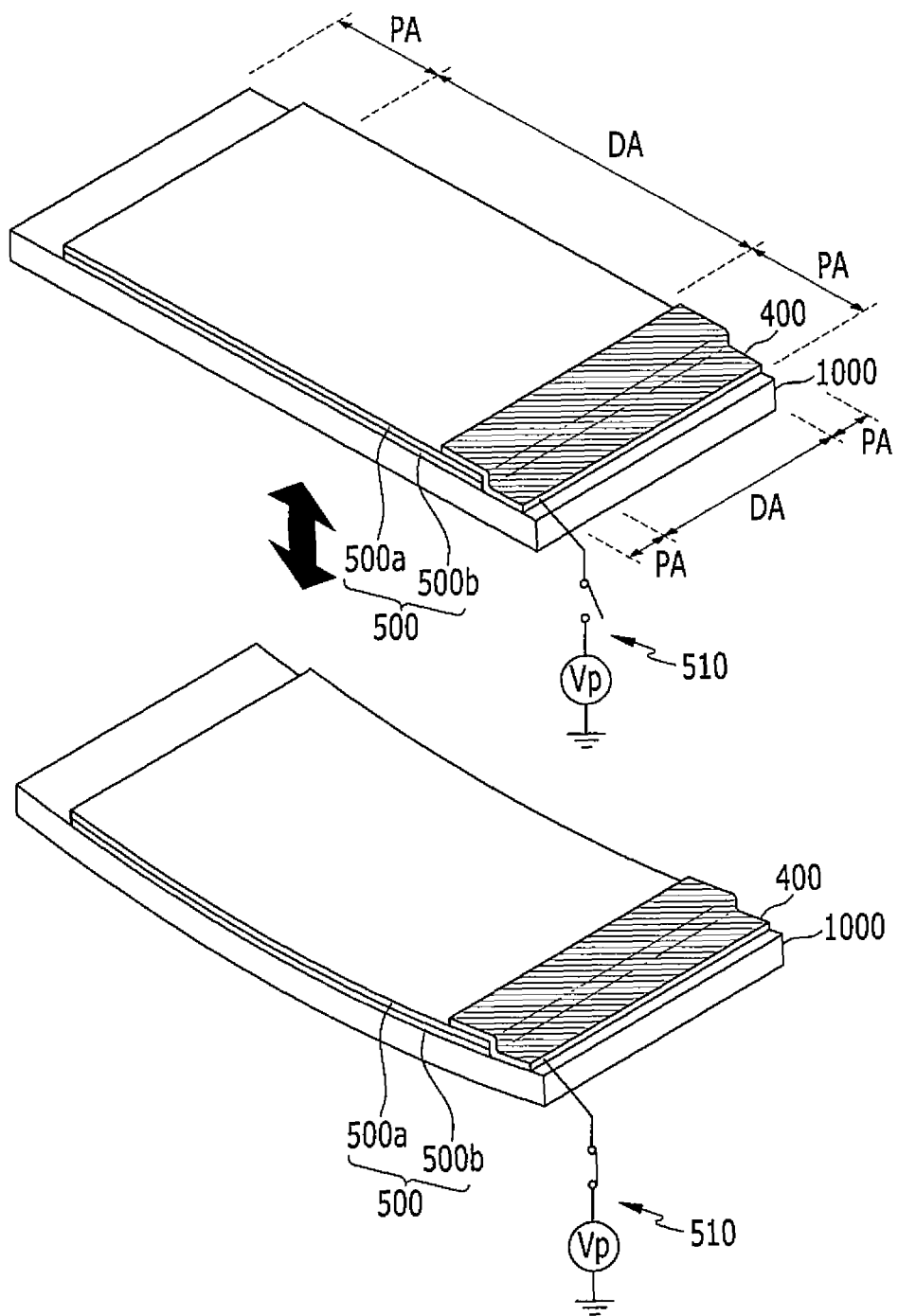

Next, the display device according to another exemplary embodiment of the present invention will be described in detail with reference to FIG. 4. The display device according to the exemplary embodiment shown in FIG. 4 is similar to the display device according to the exemplary embodiment described with reference to FIGS. 1 and 2. The same reference numerals indicate the similar constituent elements, and the detailed description of the same constituent elements is omitted. Different configurations from the above-described exemplary embodiment will be focused on.

FIG. 4 is a schematic view of a display device according to an exemplary embodiment of the present invention.

The piezoelectric material layer 500 is positioned on the display panel 1000. The piezoelectric material layer 500 of the present embodiment includes a first piezoelectric material layer 500a and a second piezoelectric material layer 500. The intermediate electrode layer 400 is positioned to cover one side of a surface of the piezoelectric material layer 500. The piezoelectric material layer driver 510 is connected to the intermediate electrode layer 400.

In the plan view, the intermediate electrode layer 400 may be quadrangular. The first piezoelectric material layer 500a and the second piezoelectric material layer 500b may have a quadrangle form, and may be positioned to correspond to the entire display area DA, and also to correspond to part of the non-display area PA near the display area DA. However, the form of the intermediate electrode 400, the first piezoelectric material layer 500a, and the second piezoelectric material layer 500b is not limited thereto. Furthermore, variations to generate the electric field to the first piezoelectric material layer 500a and the second piezoelectric material layer 500b are possible to bend the first piezoelectric material layer 500a and the second piezoelectric material layer 500b to have different forms. As such, the form and the deposition structure of the intermediate electrode layer 400, the first piezoelectric material layer 500a and the second piezoelectric material layer 500b may vary. The intermediate electrode layer 400 may be positioned to cover a side surface of the first piezoelectric material layer 500a and of the second piezoelectric material layer 500b, and may also overlap the entire first piezoelectric material layer 500a and second piezoelectric material layer 500b.

In the present exemplary embodiment, as the driving voltage Vp is applied to the intermediate electrode layer 400, the first piezoelectric material layer 500a—and the second piezoelectric material layer 500b experience an electric field of the same direction. If the electric field of the same direction is generated, the transformation (e.g., bending or deformation of the piezoelectric material layer 500b) is generated in the same direction, and causes the change in the first piezoelectric material layer 500a and the second piezoelectric material layer 500b. Accordingly, by controlling the magnitude and polarity of the driving voltage Vp, the display panel 1000 may be controlled to have the various curvatures based on the distance of the user from the display area.

Alternatively, according to the display device according to another exemplary embodiment of the present invention, electric fields of different directions may be generated to the first piezoelectric material layer 500*a*—and the second piezoelectric material layer 500*b* by adding an intermediate electrode layer. When a first intermediate electrode layer is placed between the first piezoelectric material layer 500*a*— and the second piezoelectric material layer 500*b*, a second intermediate electrode layer may be on the first piezoelectric material layer 500*a*—to apply driving voltages having different polarities to the first intermediate electrode layer and to the second intermediate electrode layer. Accordingly, electric fields of the different directions may be generated to the first piezoelectric material layer 500*a* and to the second piezoelectric material layer 500*b*. In this case, the first piezoelectric material layer 500*a* and the second piezoelectric material layer 500*b* may have transformations of different directions. Also, driving voltages with the same polarities but different magnitudes may be applied to the first intermediate electrode layer and the second intermediate electrode layer to provide the curvature to the first piezoelectric material layer 500*a* and the second piezoelectric material layer 500*b*. The materials forming the first piezoelectric material layer 500*a* and the second piezoelectric material layer 500*b* may be different from each other, according to an exemplary embodiment.

The display panel 1000 may be applied to various types of display panels that are capable of displaying the images. For example, the display panel 1000 may be a liquid crystal panel, an organic light emitting panel, or a plasma display panel.

Figure 5:
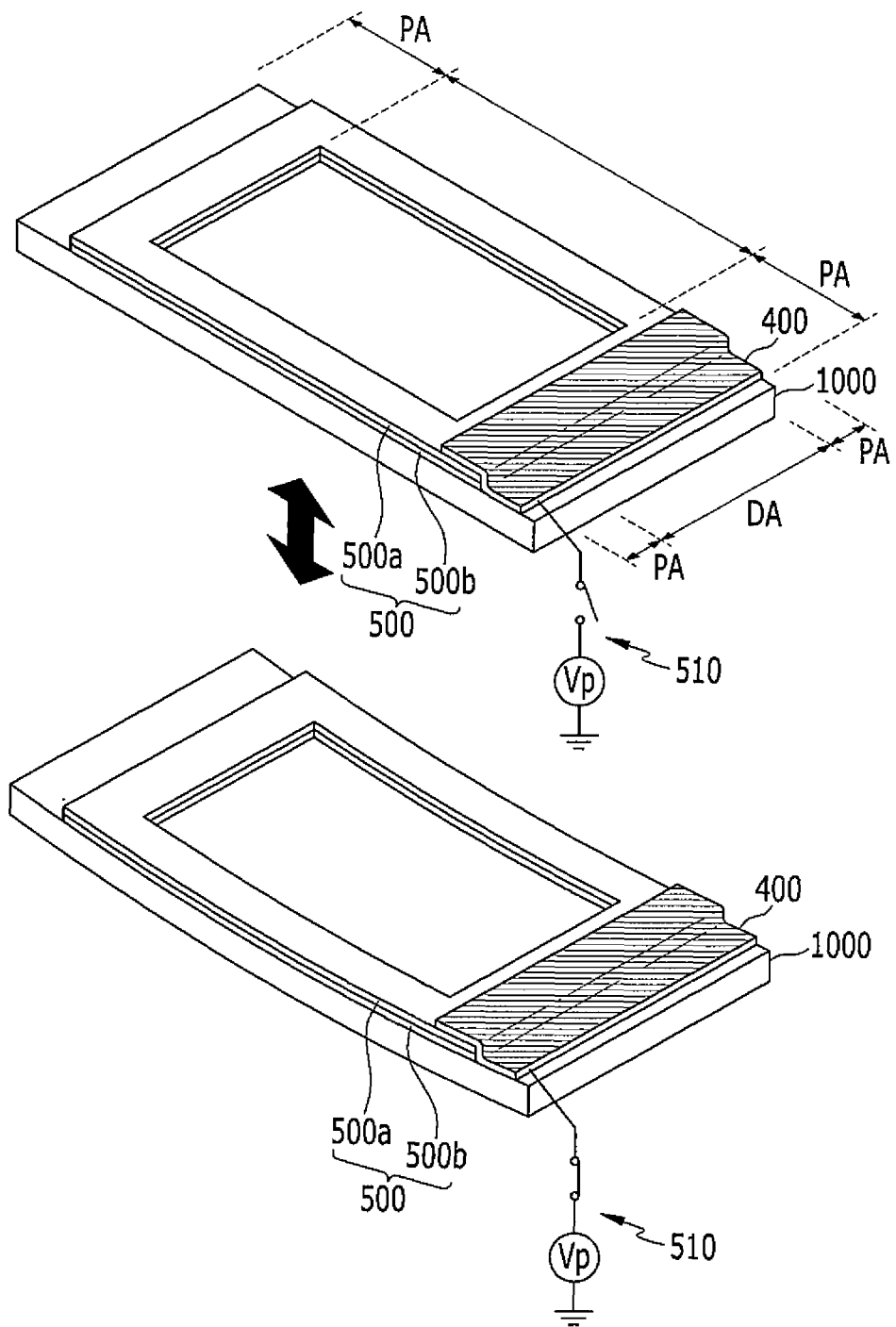

Next, a display device according to another exemplary embodiment of the present invention will be described in detail with reference to FIG. 5. The display device according to the exemplary embodiment shown in FIG. 5 is similar to the display device according to the exemplary embodiment described with reference to FIGS. 1 and 2. The same reference numerals indicate the similar constituent elements, and repeated description of the same constituent elements is omitted. Different configurations from the above-described exemplary embodiment will be highlighted.

FIG. 5 is a schematic view of a display device according to an exemplary embodiment of the present invention.

A piezoelectric material layer 500 is disposed on the display panel 1000, and the piezoelectric material layer 500 includes a first piezoelectric material layer 500*a* and a second piezoelectric material layer 500*b*. The intermediate electrode layer 400*b* is positioned to cover one side surface of the piezoelectric material layer 500. The piezoelectric material layer driver 510 is connected to the intermediate electrode layer 400.

In the present exemplary embodiment, in the plan view, the intermediate electrode layer 400 may have the quadrangle shape. The piezoelectric material layer 500 having a form that encloses, or encircles, the display area DA has a rectangular strip form that encloses the edge of the display area DA, and that overlaps part of the non-display area PA. However, the shapes of the intermediate electrode layer 400 and the piezoelectric material layer 500 are not limited thereto, and all shapes capable of forming the electric field to the piezoelectric material layer 500 to bend the piezoelectric material layer 500 are possible. Like the display device 1000 according to the present exemplary embodiment, if the piezoelectric material layer 500 is formed to enclose the display area DA, yet does not overlap an edge of the display area DA, the transmittance reduction of the display device may be prevented.

In the present exemplary embodiment, as the driving voltage Vp is applied to the intermediate electrode layer 400, the electric field of the same direction is generated toward the first piezoelectric material layer 500*a*—and the second piezoelectric material layer 500*b*. If the electric field of the same direction is formed, the first piezoelectric material layer 500*a* and the second piezoelectric material layer 500*b*—are transformed in the same direction, and are transformed to have a same form. Accordingly, by controlling the magnitude and polarity of the driving voltage Vp, the display panel 1000 may be controlled to have various curvatures based on the distance of the user from the display area DA.

Alternatively, according to the display device 1000 according to another exemplary embodiment of the present invention, the electric fields of different directions may be generated to the first piezoelectric material layer 500*a* and the second piezoelectric material layer 500*b* by adding an intermediate electrode layer.

The display panel 1000 may be applied to display panels of all kinds that are capable of displaying the images. For example, the display panel 1000 may be a liquid crystal panel, an organic light emitting panel, or a plasma display panel.

Figure 6:
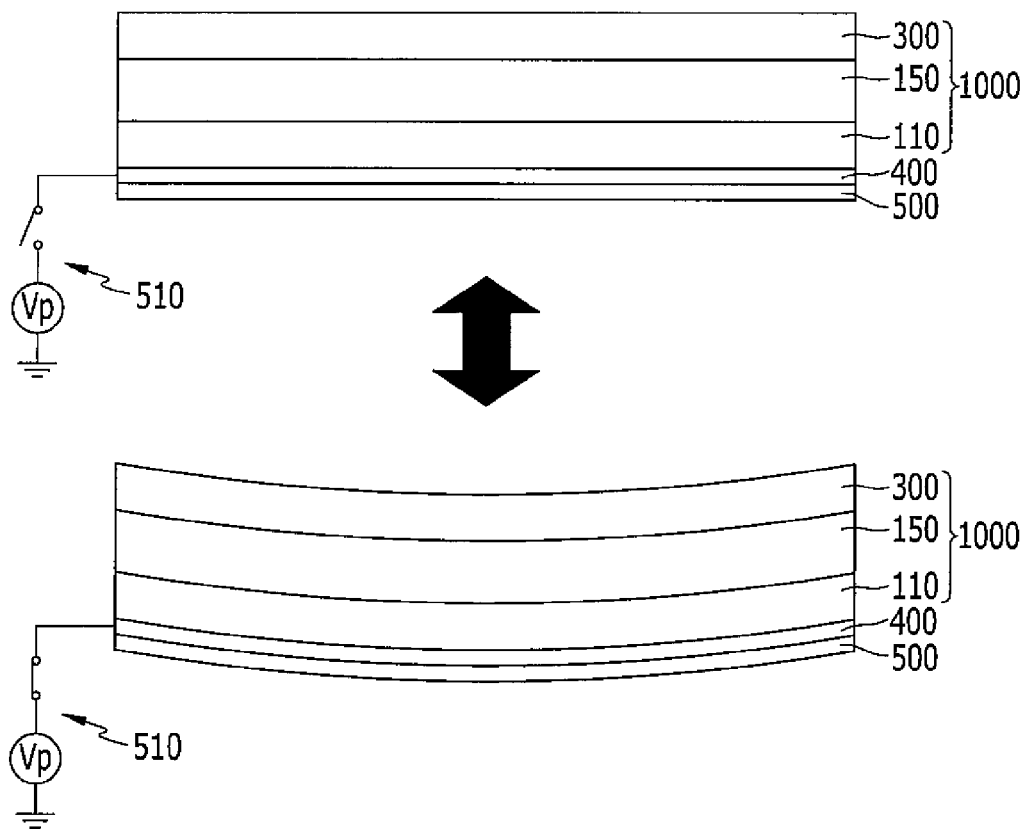

Next, the display device according to another exemplary embodiment of the present invention will be described in detail with reference to FIG. 6. The display device according to the exemplary embodiment shown in FIG. 6 is similar to the display device according to the exemplary embodiment described with reference to FIGS. 1 and 2. The same reference numerals indicate the similar constituent elements, and repeated detailed description of the same constituent elements is omitted. Configurations that are different from the above-described exemplary embodiment will be described.

FIG. 6 is a schematic view of a display device according to an exemplary embodiment of the present invention.

The intermediate electrode layer 400 is positioned under the display panel 1000, and the piezoelectric material layer 500 is disposed under the intermediate electrode layer 400. The piezoelectric material layer driver 510 is connected to the intermediate electrode layer 400. The intermediate electrode layer 400 may be positioned under the first substrate 110.

The display panel 1000 may be the liquid crystal display (LCD), and in this case, the display panel 1000 includes the flexible first substrate 110, the thin film layer 150, and the liquid crystal layer 300. A second substrate facing the first substrate 110, with the thin film layer 150 and the liquid crystal layer 300 interposed therebetween, may also be positioned, although the second substrate may be omitted, as shown in FIG. 6.

In the plan view, the intermediate electrode layer 400 and the piezoelectric material layer 500 may have a quadrangle shape, and may be positioned to cover an entirety of the display area DA, and may also cover a part of the non-display area PA adjacent the display area DA. However, the forms of the intermediate electrode layer 400 and the piezoelectric material layer 500 are not limited thereto, and the form enclosing the edge of the display area DA may be positioned to overlap the part of the non-display area PA. Also, a plurality of piezoelectric material layers may be additionally disposed.

FIG. 6 is the schematic view of the display panel 1000, but the structure of the display panel 1000 is not limited thereto, and display panels of different types that are capable of displaying the image may be applied. For example, the display panel 1000 may be an organic light emitting panel or a plasma display panel. When the display panel 1000 is the organic light emitting diode display, the display panel 1000 may include the flexible first substrate 110, the thin film layer 150, the organic emission layer 300, and an encapsulation substrate facing the first substrate 110 with the thin film layer 150 and the organic emission layer 300 therebetween, although it should be noted that the encapsulation substrate may be omitted, as shown in FIG. 6. Also, an encapsulation layer made of the organic material may be positioned instead of the encapsulation substrate.

Figure 7:
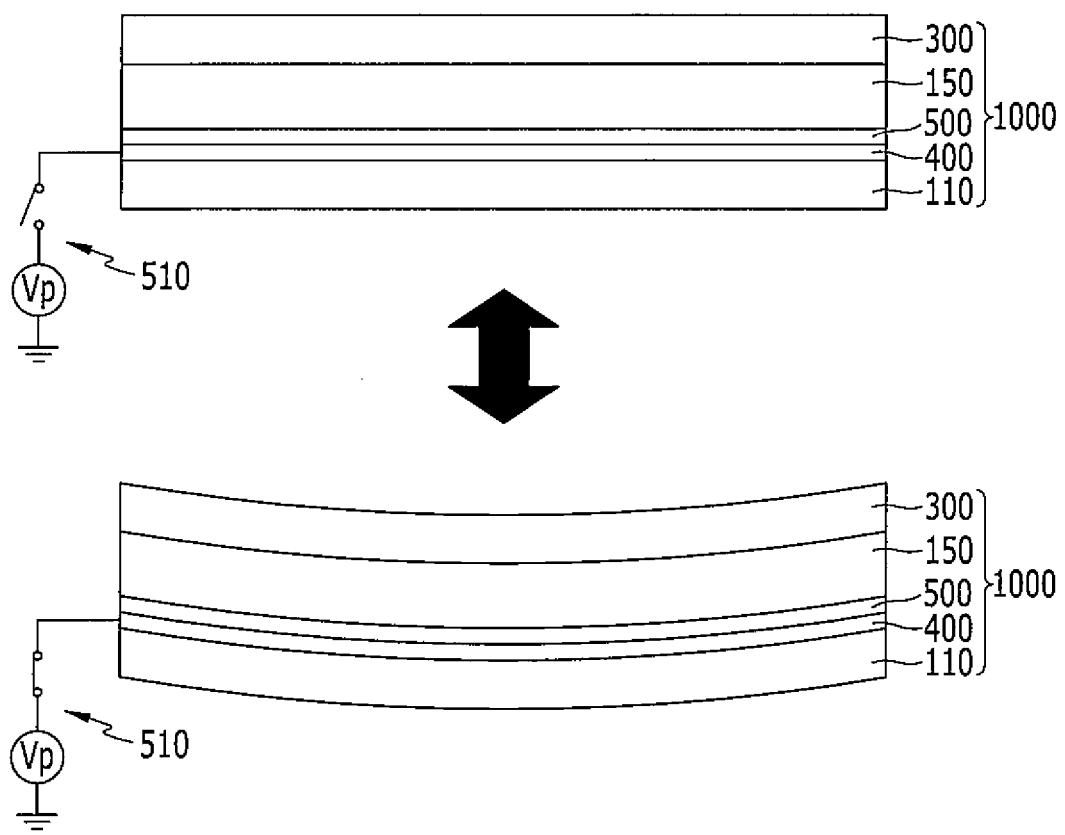

Next, the display device according to another exemplary embodiment of the present invention will be described in detail with reference to FIG. 7. The display device according to the exemplary embodiment shown in FIG. 7 is similar to the display device according to the exemplary embodiment described with reference to FIGS. 1 and 2. The same reference numerals indicate the similar constituent elements, and repeated description of the same constituent elements is omitted. Differences in configurations from the above-described exemplary embodiment will be discussed.

FIG. 7 is a schematic view of a display device according to an exemplary embodiment of the present invention.

In the present exemplary embodiment, the intermediate electrode layer 400 and the piezoelectric material layer 500 are positioned inside the display panel 1000. The piezoelectric material layer driver 510 is connected to the intermediate electrode layer 400. The intermediate electrode layer 400 may be disposed on the first substrate 110.

The display panel 1000 may be a liquid crystal display, and may include the flexible first substrate 110, the thin film layer 150, and the liquid crystal layer 300. The display panel 1000 may also include a second substrate facing the first substrate 110 with the thin film layer 150 and the liquid crystal layer 300 interposed therebetween, although the second substrate may be omitted, as shown in FIG. 7.

If the driving voltage Vp of the first polarity is applied to the intermediate electrode layer 400 by the piezoelectric material layer driver 510, the electric field is generated to the piezoelectric material layer 500 such that the curvature of the display panel 1000 may be transformed, or changed, depending on the form of the piezoelectric material layer 500. The curvature of the display panel 1000 may be variably formed according to the magnitude of the driving voltage Vp.

In the plan view, the intermediate electrode layer 400 and the piezoelectric material layer 500 may have a quadrangle shape, and may be positioned at the entire display area DA, and also positioned at part of the non-display area PA near the display area DA. However, the form of the intermediate electrode layer 400 and the piezoelectric material layer 500 is not limited thereto, and the form that encloses the edge of the display area DA may overlap the part of the non-display area PA. Also, a plurality of piezoelectric material layers may be additionally disposed.

FIG. 7 is the schematic view of the display panel 1000, but the structure of the display panel 1000 is not limited thereto, and display panels of all kinds that are capable of displaying the image may be applied. For example, the display panel 1000 may be an organic light emitting panel, or may be a plasma display panel. When the display panel 1000 is the organic light emitting diode display, the display panel 1000 may include the flexible first substrate 110, the thin film layer 150, the organic emission layer 300, and may also include an encapsulation substrate facing the first substrate 110 with the thin film layer 150 and the organic emission layer 300 therebetween, although the encapsulation substrate may be omitted, as shown in FIG. 7. Also, an encapsulation layer made of organic material may be used instead of the encapsulation substrate.

Figure 8:
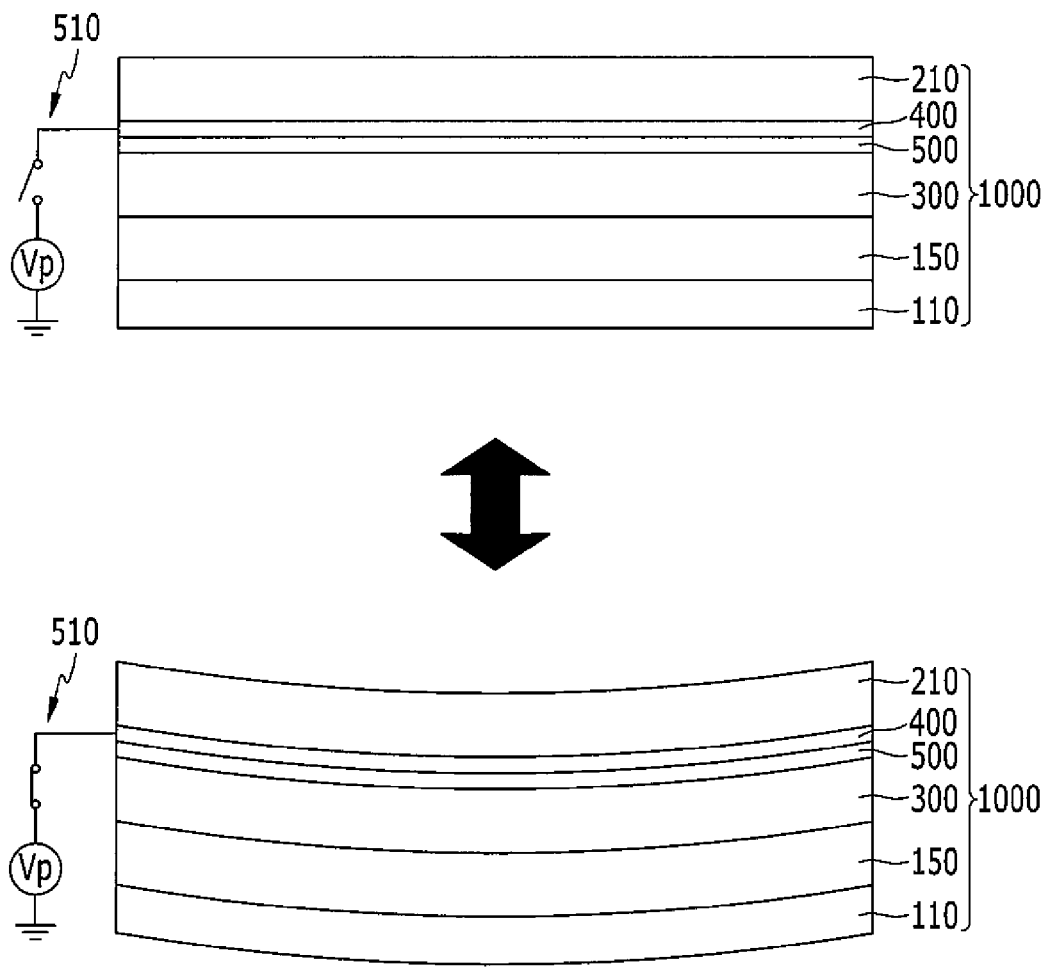

Next, the display device according to another exemplary embodiment of the present invention will be described in detail with reference to FIG. 8. The display device according to the exemplary embodiment shown in FIG. 8 is similar to the display device according to the exemplary embodiment described with reference to FIGS. 1 and 2. The same reference numerals indicate the similar constituent elements, and the detailed description of the same constituent elements is omitted. Different configurations from the above-described exemplary embodiment will be focused on.

FIG. 8 is a schematic view of a display device according to an exemplary embodiment of the present invention.

In the present exemplary embodiment, the intermediate electrode layer 400 and the piezoelectric material layer 500 are positioned inside the display panel 1000. The piezoelectric material layer driver 510 is connected to the intermediate electrode layer 400. The intermediate electrode layer 400 is positioned under the second substrate 210, and the piezoelectric material layer 500 is positioned thereunder.

The display panel 1000 may be a liquid crystal display, and in this case, the display panel 1000 includes the flexible first substrate 110, the flexible second substrate 210, and the thin film layer 150 and the liquid crystal layer 300 positioned between the first substrate 110 and the second substrate 210.

In the plan view, the intermediate electrode layer 400 and the piezoelectric material layer 500 may have a quadrangle shape, and may be positioned to correspond to an entirety of the display area DA as well as part of the non-display area PA around the display area DA. However, the form of the intermediate electrode layer 400 and the piezoelectric material layer 500 is not limited thereto, and the form that encloses the edge of the display area DA may overlap the part of the non-display area PA. Also, a plurality of piezoelectric material layers may be additionally disposed.

FIG. 8 is the schematic view of the display panel 1000, but the structure of the display panel 1000 is not limited thereto, and display panels of all kinds, which are capable of displaying the image, may be applied. For example, the display panel 1000 may be an organic light emitting panel or a plasma display panel. When the display panel 1000 is the organic light emitting diode display, the display panel 1000 may include the flexible first substrate 110, the encapsulation substrate 210, and the thin film layer 150, and may also include the organic emission layer 300 positioned between the first substrate 110 and the encapsulation substrate 210.

Figure 9:
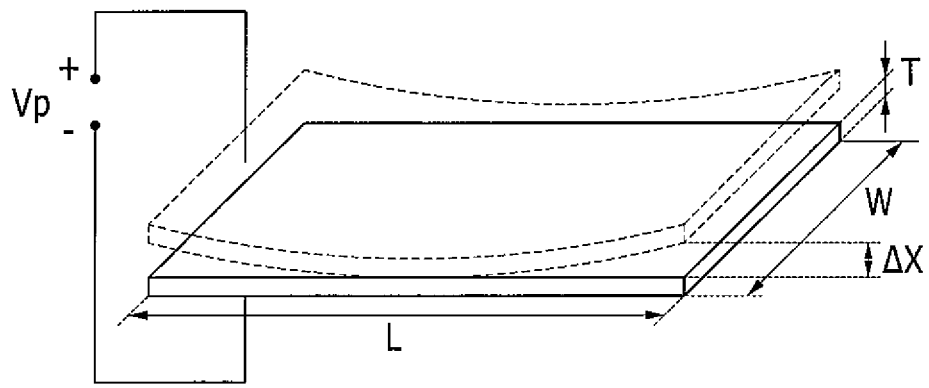
FIG. 9 is a table showing a result of an experimental example.

An experimental example will be described with reference to FIG. 9. FIG. 9 is a table showing a result of an experimental example.

In the experimental example of FIG. 9, a predetermined driving voltage Vp is applied to a 40 inch piezoelectric material layer having a transverse length (L) of about 895 mm, a longitudinal length (W) of about 509 mm, and a thickness (e.g., predetermined thickness) (T). A moved distance, or displacement distance, ($\Delta X$) as the piezoelectric material layer is bent is referred to as 1, and in the state that the thickness (T) and the driving voltage Vp are maintained, when the transverse length (L) and the longitudinal length (W) are changed, a transformation ratio ($\Delta X$) depending on the size of the piezoelectric material layer is measured.

Under the same thickness (T) and the same driving voltage Vp, when the transformation ratio of the 40 inch piezoelectric material layer is referred to as 1, the transformation ratio of the piezoelectric material layer having a 48 inch size is 1.191. This means that the curvature of the piezoelectric material layer is larger as the transformation ratio is increased. Also, when the size of the piezoelectric material layer is respectively 55 inches, 65 inches, and 75 inches, it may be confirmed that the transformation ratio is gradually increased as 1.365, 1.614, and 1.860, respectively. That is, as the size of the applied piezoelectric material layer is increased, when the size of the display device is increased, a larger curvature may be realized by the same voltage. In other words, because the size of the applied piezoelectric material layer is increased as the size of the display device is increased, the same curvature may be realized by a smaller voltage. The present invention may be used for the extra-large display device having a merit in which immersion and tension are increased as size is increased, and the same curvature may be realized by a smaller voltage as the size of the display device is increased.

Figure 10:
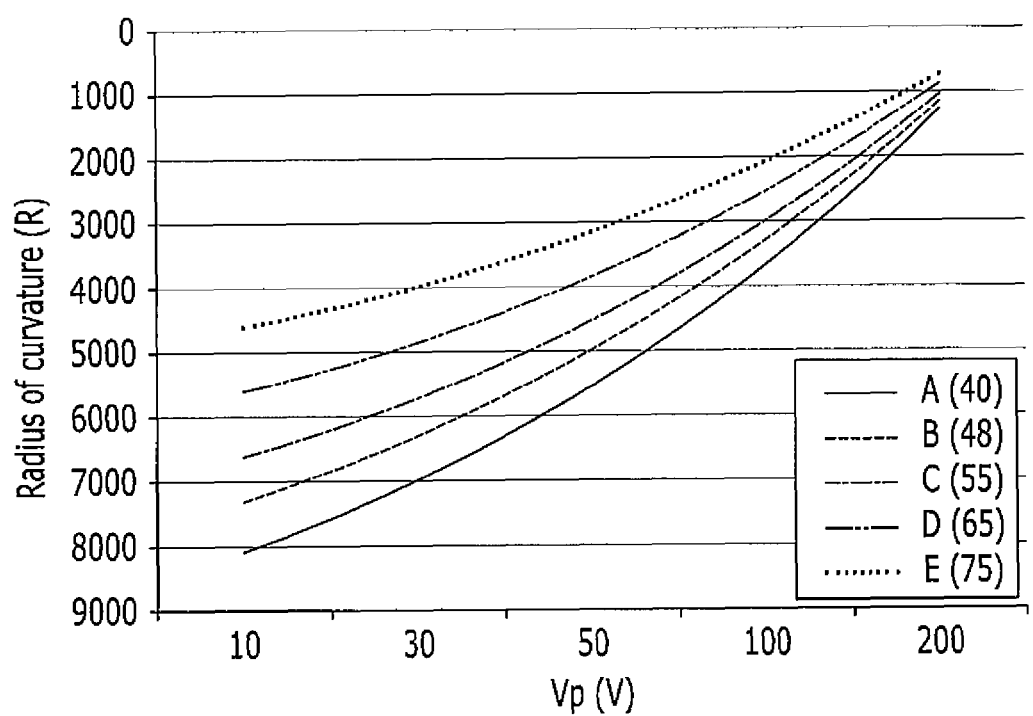
FIG. 10 is a graph showing a result of an experimental example.

An experimental example will now be described with reference to FIG. 10. FIG. 10 is a graph showing a result of an experimental example.

In the experimental example of FIG. 10, while the driving voltage Vp applied to the intermediate electrode adjacent the piezoelectric material layer is changed in the range of more than about 10 V to less than about 200 V, the change of the radius of curvature of the piezoelectric material layer is measured, and lines A, B, C, D, and E in the graph represent the radius of curvature measuring result when the piezoelectric material layer is 40, 48, 55, 65, and 75 inches, respectively.

Referring to the line A when the piezoelectric material layer is 40 inches, as the driving voltage Vp applied to the intermediate electrode adjacent to the piezoelectric material layer is gradually increased from about 10 V to about 200 V, it may be confirmed that the radius of curvature of the piezoelectric material layer is decreased from about 8000R to be close to about 1000R. That is, the curvature is increased as the driving voltage Vp is increased in the piezoelectric material layer of the same size. Likewise, for the line B of 48 inches, the line C of 55 inches, the line D of 65 inches, and the line E of 75 inches, the range in which the radius of curvature is changed is different depending on a size of the piezoelectric material layer, although it may be confirmed that the radius of curvature is decreased as the driving voltage Vp is increased. The radius of curvature—of the piezoelectric material layer, which corresponds to the driving voltage Vp of more than about 10 V to less than about 200 V, is in the range of more than about 1000R to less than about 8000R, and may be changed depending on the size of the display device, the area of the piezoelectric material layer, and the like. In the graph of FIG. 10, as the size of the piezoelectric material layer is increased for the same driving voltage, it may be confirmed that the radius of curvature is smaller, which confirms the result described in the above FIG. 9.

In a case of the flat display device, distances from an eye of a viewer to a plurality of pixels included in the display device are respectively different from each other. For example, the distance may be farther to pixels positioned at the right and left edges from the eye of the viewer than the distance to a pixel at a center of the flat display device. In contrast, in the display device according to an exemplary embodiment of the present invention, the curvature of the display device may depend on the voltage applied to the piezoelectric material layer. Accordingly, when a center of a circle formed by extending a curved surface is a position of the eye of the viewer, the distances from the eye of the viewer to a plurality of pixels are approximately constant. Because this curved surface display device has a wide viewing angle, when compared to the flat display device, a large amount of information stimulates a photoreceptor of the eye such that more visual information is transmitted to a brain through an optic nerve. Accordingly, a realistic, immersive view may be further enhanced.

Also, because the display device according to the present invention has the curvature that may be varied depending on the voltage applied to the piezoelectric material layer, the curvature of the display device may be changed depending on the viewing distance and depending on an environment of the viewer. As described above, the curved display device having the radius of curvature of more than about 1000R to less than about 8000R may be realized in the range of more than about 10 V to less than about 200 V of the driving voltage Vp applied to the piezoelectric material layer. Accordingly, even if the viewing distance is changed, the curvature may be changed to impart the immersive effect to the viewer depending on the distance. As described above, because the piezoelectric material layer of the display device according to an exemplary embodiment of the present invention may be formed by the CVD process, the sputtering process, and the like, the thickness is thin as an angstrom level, thereby reducing the volume of the display device compared with a comparative example using a motor of a mechanical type, and realizing a reduction of production cost.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

DESCRIPTION OF SOME OF THE REFERENCE CHARACTERS

| | |
|---|---|
| DA: display area | PA: non-display area |
| 110: first substrate | 150: thin film layer |
| 400: intermediate electrode layer | 500: piezoelectric material layer |
| 510: piezoelectric material driver | 1000: display panel |

What is claimed is:

1. A display device comprising:
    a flexible first substrate comprising a display area, and a non-display area around the display area;
    a first piezoelectric material layer at one side of the first substrate such that a first surface of the first piezoelectric material layer faces the one side of the first substrate;
    an intermediate electrode layer contacting the first piezoelectric material layer at a second surface of the first piezoelectric material layer that is opposite the first surface of the first piezoelectric material layer, and contacting the first piezoelectric material layer at a side surface of the first piezoelectric material layer that is orthogonal to both the first surface of the first piezoelectric material layer and the second surface of the first piezoelectric material layer;
    a piezoelectric material layer driver coupled to the intermediate electrode layer, and configured to apply a driving voltage to the intermediate electrode layer to form an electric field at the first piezoelectric material layer;

a thin film transistor at the one side of the first substrate; and a pixel electrode connected to the thin film transistor.

2. The display device of claim 1, further comprising a display panel,
wherein the first piezoelectric material layer is configured to be transformed according to the driving voltage, and
wherein the display panel is configured to have a radius of curvature that corresponds to a distance of a user from the display area depending on transformation of the first piezoelectric material layer.

3. The display device of claim 2, wherein the piezoelectric material layer driver is configured to apply the driving voltage of more than about 10 V to less than about 200 V.

4. The display device of claim 3, wherein a thickness of the first piezoelectric material layer is less than about 4000 Å.

5. The display device of claim 4, further comprising a second piezoelectric material layer overlapping and directly contacting the first piezoelectric material layer.

6. The display device of claim 5, wherein the first piezoelectric material layer and the second piezoelectric material layer are formed with an electric field of the same direction.

7. The display device of claim 5, wherein the intermediate electrode layer covers a side surface of the second piezoelectric material layer.

8. The display device of claim 7, wherein the first piezoelectric material layer and the second piezoelectric material layer cover an entirety of the display area and part of the non-display area.

9. The display device of claim 8, wherein the piezoelectric material layer driver is configured to apply the driving voltage to form the electric field of a same direction at the first piezoelectric material layer and the second piezoelectric material layer.

10. The display device of claim 7, wherein the first piezoelectric material layer and the second piezoelectric material layer overlap the non-display area to encircle the display area.

11. The display device of claim 10, further comprising:
a flexible second substrate facing the first substrate; and
a liquid crystal layer or an organic emission layer between the first substrate and the second substrate.

12. The display device of claim 4, wherein the intermediate electrode layer covers an entirety of the display area and a part of the non-display area.

13. The display device of claim 12, wherein the first piezoelectric material layer covers an entirety of the display area and a part of the non-display area.

14. The display device of claim 12, wherein the first piezoelectric material layer overlaps part of the non-display area to encircle the display area.

15. The display device of claim 14, further comprising:
a flexible second substrate facing the first substrate; and
a liquid crystal layer or an organic emission layer between the first substrate and the second substrate.

16. The display device of claim 2, wherein the intermediate electrode layer is positioned at an entirety of the display area and part of the non-display area.

17. The display device of claim 16, wherein the first piezoelectric material layer covers the entirety of the display area and the part of the non-display area.

18. The display device of claim 16, wherein the first piezoelectric material layer overlaps a part of the non-display area to encircle the display area.

19. The display device of claim 18, further comprising:
a flexible second substrate facing the first substrate; and
a liquid crystal layer or an organic emission layer between the first substrate and the second substrate.

* * * * *